US008912087B2

(12) United States Patent
Hirtreiter et al.

(10) Patent No.: US 8,912,087 B2
(45) Date of Patent: Dec. 16, 2014

(54) METHOD OF FABRICATING A CHIP PACKAGE

(75) Inventors: Josef Hirtreiter, Viechtach (DE); Walter Hartner, Bad Abbach (DE); Ulrich Wachter, Regensburg (DE); Juergen Foerster, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/563,833

(22) Filed: Aug. 1, 2012

(65) Prior Publication Data

US 2014/0035127 A1    Feb. 6, 2014

(51) Int. Cl.
H01L 21/44    (2006.01)
H01L 23/48    (2006.01)
H01L 21/283    (2006.01)
H01L 23/00    (2006.01)

(52) U.S. Cl.
CPC .............. H01L 21/283 (2013.01); H01L 24/11 (2013.01)
USPC ........... 438/612; 438/637; 438/642; 257/738; 257/774; 257/786

(58) Field of Classification Search
CPC ..... H01L 21/283; H01L 24/11; H01L 21/441; H01L 24/13; H01L 24/05; H01L 23/49816; H01L 24/16; H01L 2224/12105
See application file for complete search history.

(56) References Cited

U.S. PATENT DOCUMENTS

| 6,642,136 | B1 * | 11/2003 | Lee et al. | 438/613 |
|---|---|---|---|---|
| 7,468,545 | B2 * | 12/2008 | Lin et al. | 257/622 |
| 8,110,914 | B2 * | 2/2012 | Kang et al. | 257/692 |
| 2003/0077871 | A1 * | 4/2003 | Cheng et al. | 438/381 |
| 2004/0032024 | A1 * | 2/2004 | Lee et al. | 257/734 |
| 2007/0102815 | A1 * | 5/2007 | Kaufmann et al. | 257/737 |
| 2008/0150161 | A1 * | 6/2008 | Lin et al. | 257/778 |
| 2008/0248614 | A1 * | 10/2008 | Yang et al. | 438/118 |
| 2009/0096098 | A1 * | 4/2009 | Yang et al. | 257/738 |
| 2009/0174052 | A1 * | 7/2009 | Sogawa et al. | 257/690 |
| 2010/0013091 | A1 * | 1/2010 | Meyer et al. | 257/737 |
| 2011/0198748 | A1 * | 8/2011 | Koike | 257/737 |
| 2012/0129297 | A1 * | 5/2012 | Kang et al. | 438/113 |

OTHER PUBLICATIONS http://www.electrochemicals.com/eless_cu.html, "Electro-brite electroless copper", pp. 1-6.

* cited by examiner

Primary Examiner — Alonzo Chambliss

(57) ABSTRACT

A method for manufacturing a chip package is provided. The method includes: forming an electrically insulating material over a chip side; selectively removing at least part of the electrically insulating material thereby forming a trench in the electrically insulating material, depositing electrically conductive material in the trench wherein the electrically conductive material is electrically connected to at least one contact pad formed over the chip side; forming an electrically conductive structure over the electrically insulating material, wherein at least part of the electrically conductive structure is in direct physical and electrical connection with the electrically conductive material; and depositing a joining structure over the electrically conductive structure.

25 Claims, 15 Drawing Sheets

Prior Art

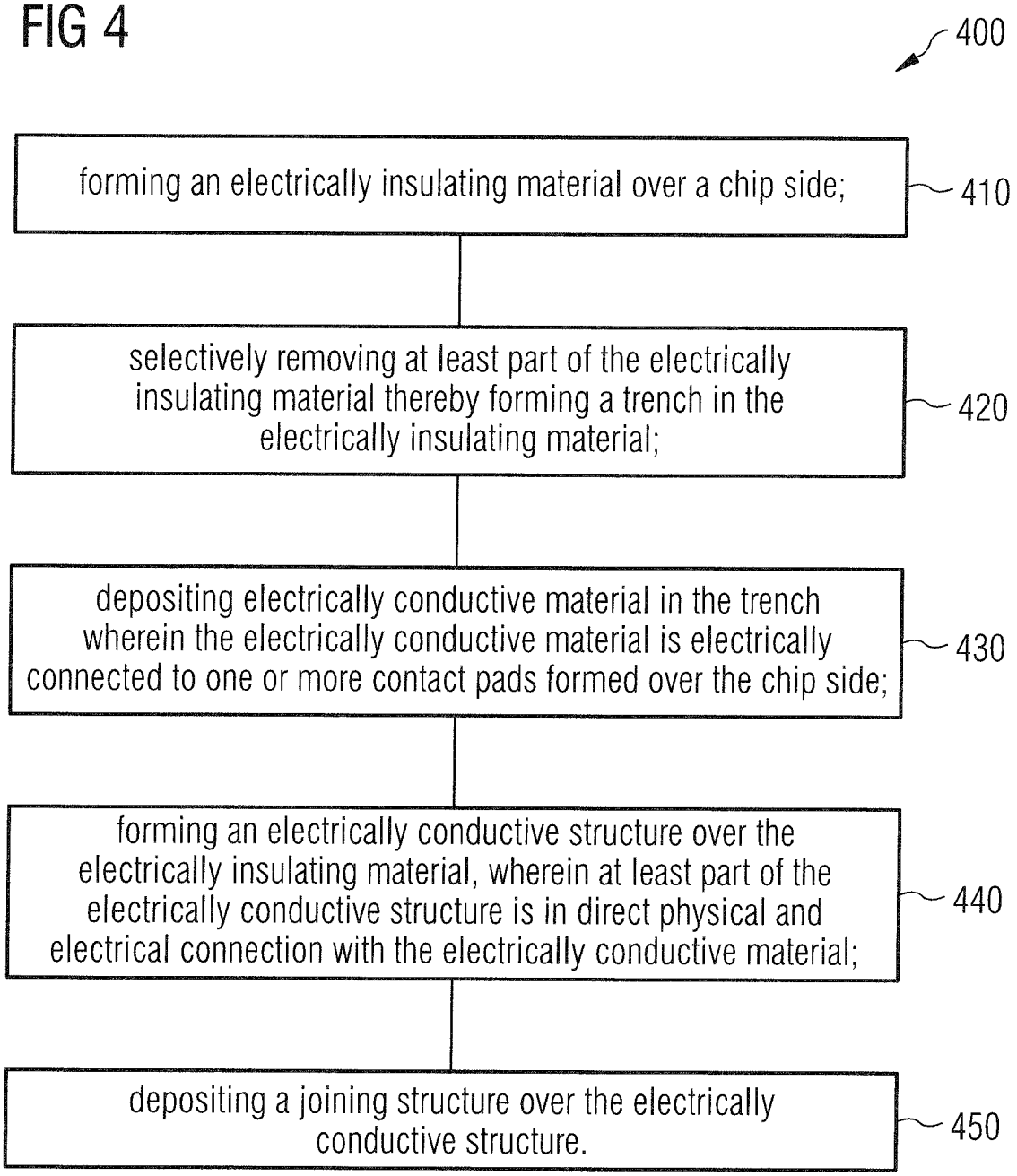

METHOD OF FABRICATING A CHIP PACKAGE

TECHNICAL FIELD

Various embodiments relate generally to a chip package and a method for manufacturing a chip package.

BACKGROUND

In chip packaging technology, for example, in manufacturing of a package for a chip 102, galvanically deposited copper may be used for the processing of copper lines, e.g. copper wires 104, or copper pads 106, as shown in FIG. 1A. As shown further in FIG. 1B, a thin seed layer 108, which may normally be Cu, may be deposited. Additionally, an adhesion layer 112, which may function e.g. as an adhesion promoter e.g. as a diffusions barrier layer as metal ion barrier, may be arranged under the thin Cu seed layer 108. Typical materials for adhesion layer and/or barrier layer 112 may be TiW, TiN, TaN. Subsequent lithographic process may be carried out which may include the formation of patterned resist 114, as shown in FIG. 1C. As shown in FIG. 1D, through the lithographic process, such as through the use of resist 114 and the under-deposited metal seed layer 108, under-bump metallization (UBM) copper may be deposited. UBM copper may include first portion 116 of copper material which may be galvanically deposited over the mask level, and further portion of copper material 118 may be formed over first portion 116 and over the dielectric layer. As shown in FIG. 1E, the resist 114 may be removed. Additionally, as shown in FIG. 1F, after the formation of the UBM copper 118, 116, the UBM copper 118, 116 may be used to connect to a metal ball 122, e.g. solder ball, which may be used as an electrical interconnection between the chip components, e.g. chip 102, and a printed circuit board (PCB). UBM copper 118, 116 may not only increase the overall provided copper thickness, as copper may be consumed, e.g. through progressing copper consumption by intermetallic phase formation, e.g. through subsequent solder process, e.g. through temperature exposure. Furthermore, UBM copper 118, 116 may also change the structural construction of the connection between the ball 122 to chip 102. These changes in mechanical constructions with UBM copper 118, 116 may lead to a higher cycle stability. For example, temperature cycling on board (TCOB) may be stable for significantly greater than 1000 cycles, from −40° C. to 125° C.

Similar process steps as those already used for manufacturing of copper lines 104, e.g. pads 106, may be used for the production of UBM copper 118, including copper material 116. UBM copper 118, 116 may generally be formed, after depositing the copper pads 106 and the solder stops 124, e.g. dielectric 2, adhesion layer 112 and seed layer 108. Furthermore, following lithography, UBM copper plating for the formation of UBM copper 118, 116 may be carried out.

SUMMARY

Various embodiments provide a method for manufacturing a chip package, the method including: forming an electrically insulating material over a chip side; selectively removing at least part of the electrically insulating material thereby forming a trench in the electrically insulating material; depositing electrically conductive material in the trench wherein the electrically conductive material is electrically connected to at least one contact pad formed over the chip side; forming an electrically conductive structure over the electrically insulating material, wherein at least part of the electrically conductive structure is in direct physical and electrical connection with the electrically conductive material; and depositing a joining structure over the electrically conductive structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 4 shows a method for manufacturing a chip package according to an embodiment;

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Figure 1A:
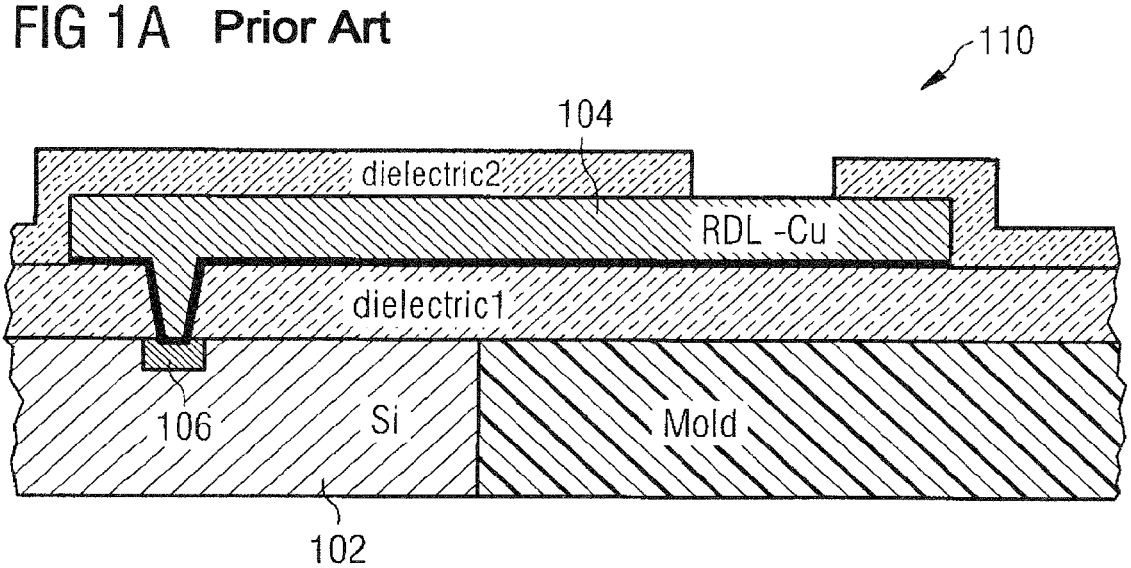
FIGS. 1A to 1F show a method for manufacturing a chip package.
Figure 1B:
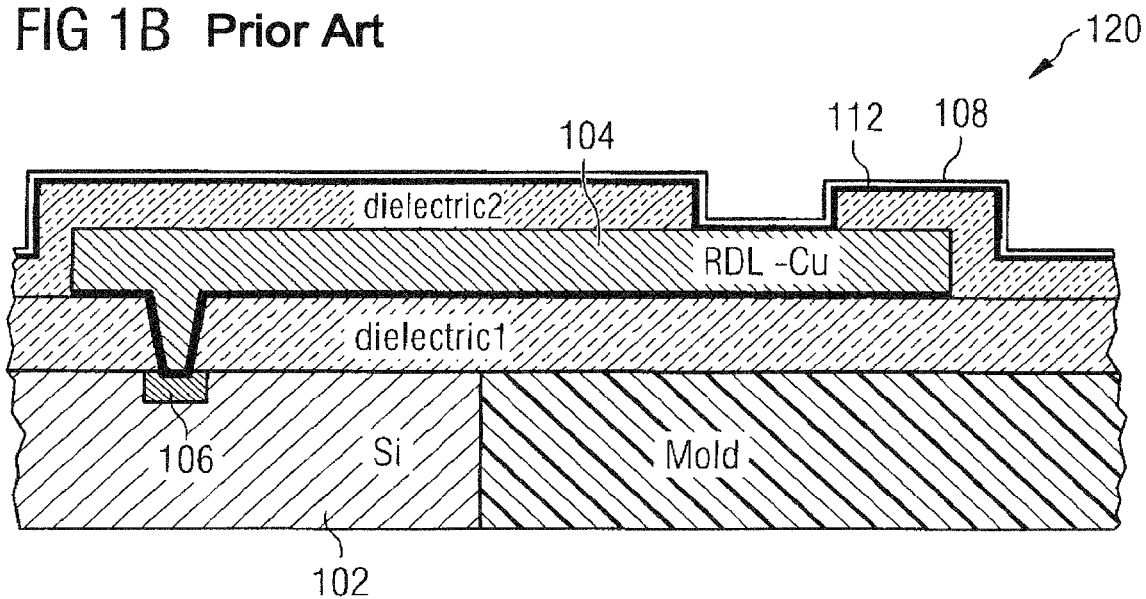
Figure 1C:
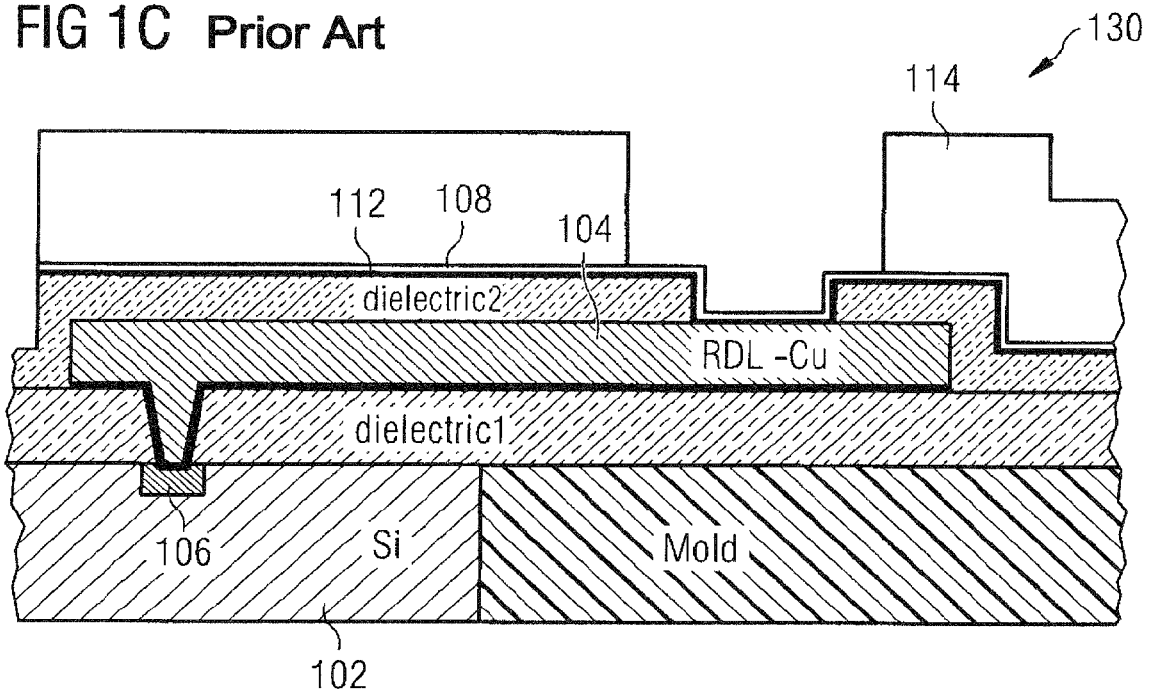
Figure 1D:
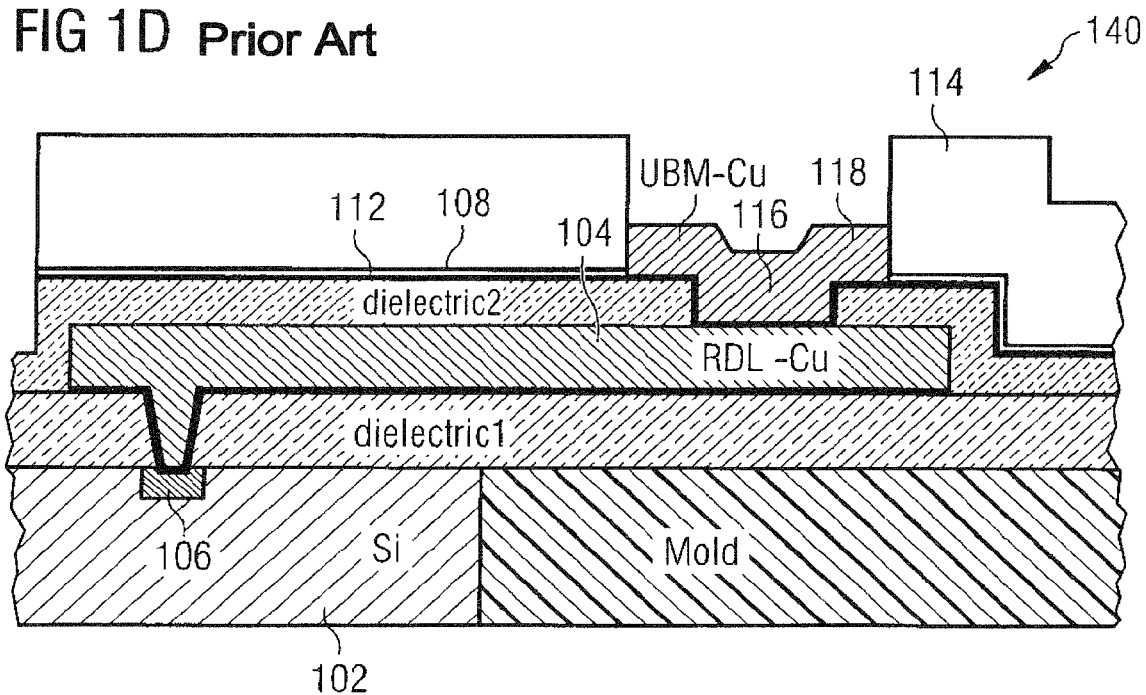
Figure 1E:
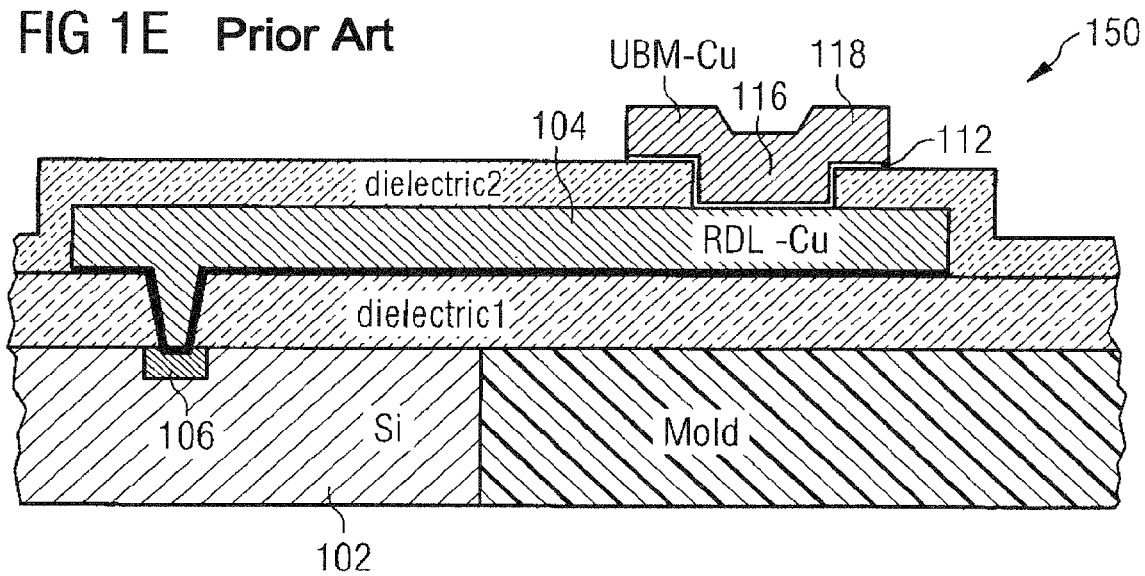
Figure 1F:
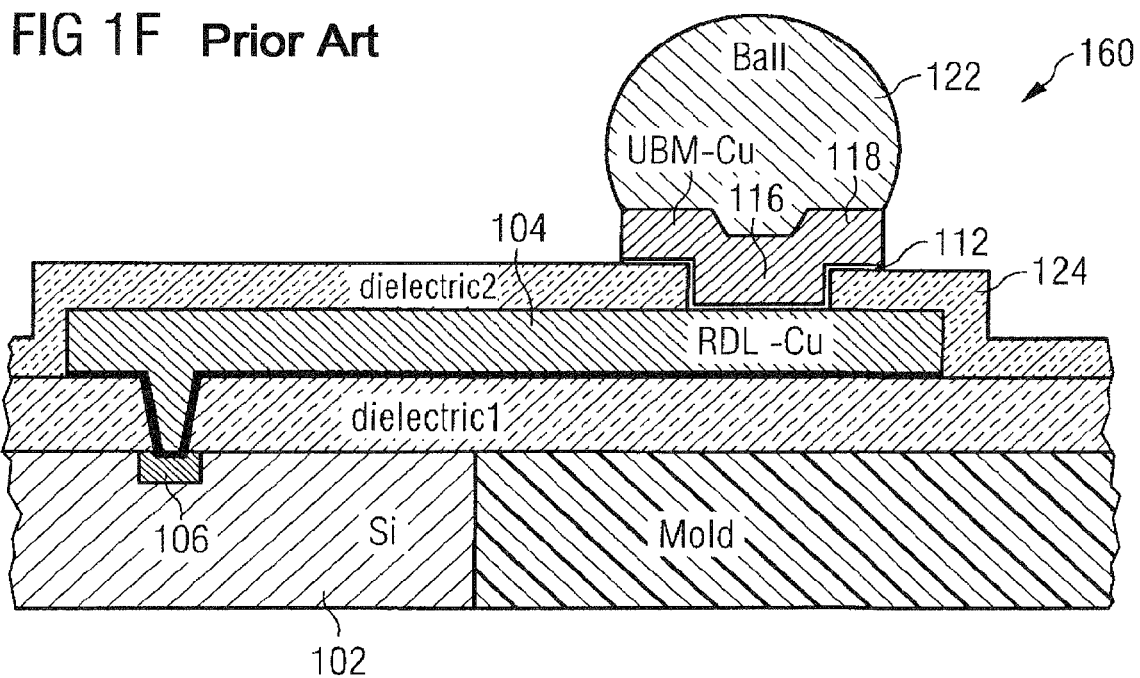
Figure 2B:
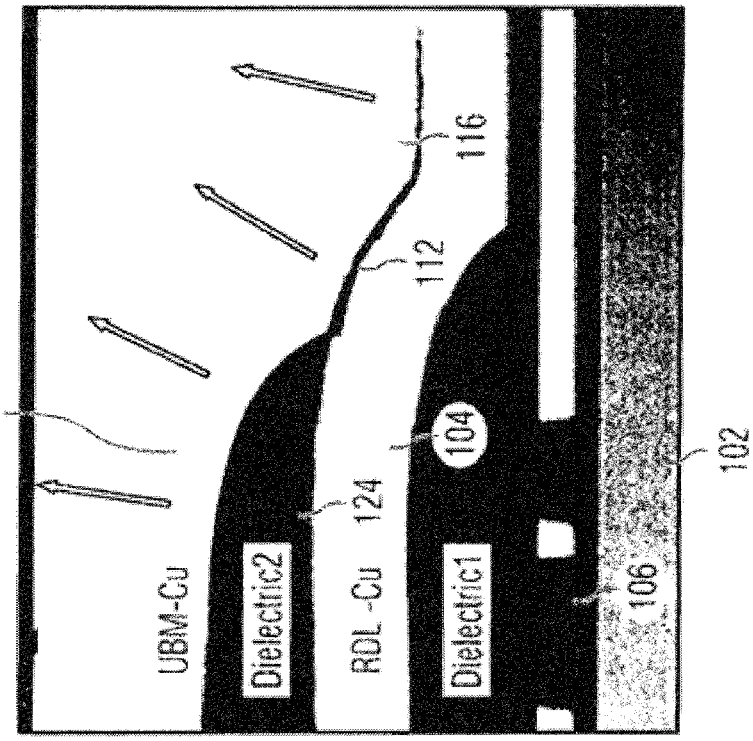
FIG. 2B shows delamination of UBM wings on redistribution layer RDL copper.
Figure 2A:
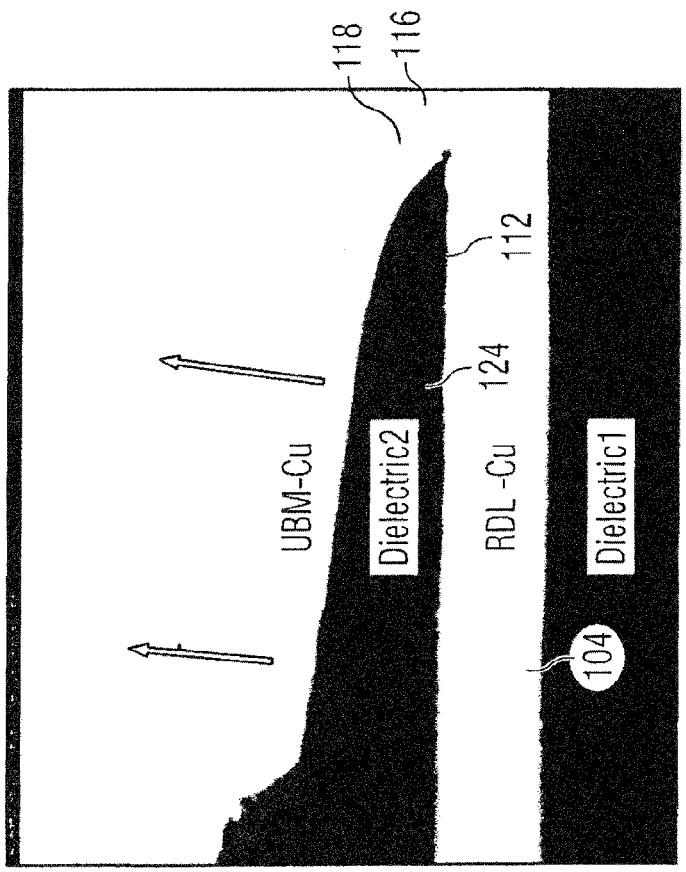
FIG. 2A shows delamination of UBM wings on dielectric material.

Through the use of the adhesion layer 112, e.g. TiW adhesion layer, as shown in FIGS. 1B to 1F, there may be a tendency towards a better adhesion on dielectric layer 124, e.g. dielectric2. As has been found, however, the adhesion between UBM copper 118 and dielectric layer 124, e.g. dielectric2, may no longer exist after temperature cycling, or may no longer be as well adhered as it was before. As shown in FIG. 2A, delamination (in the direction indicated by arrows) of UBM copper 118, i.e. UBM wing lift, from dielectric layer 124, e.g. dielectric2 occurs.

Figure 2D:
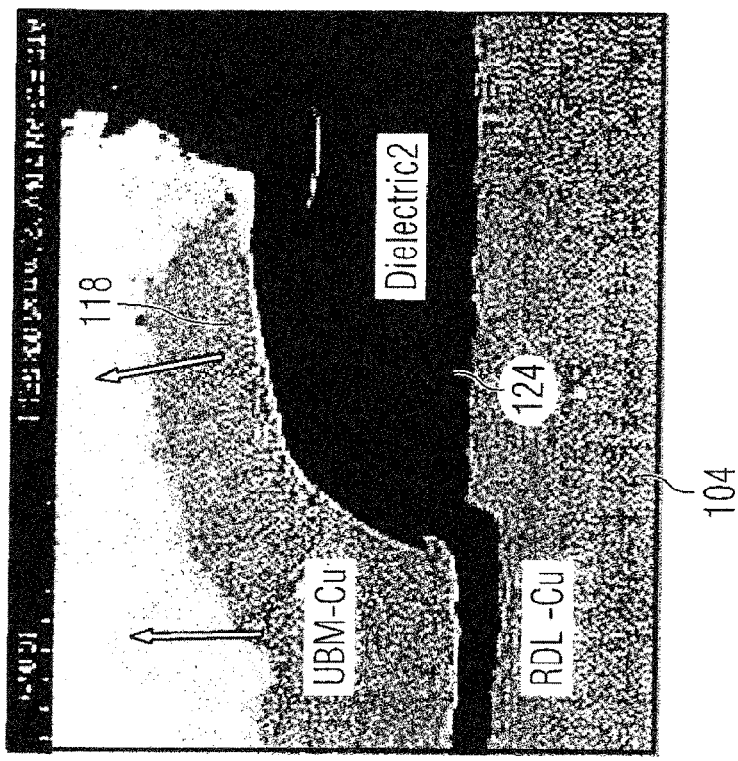
FIGS. 2C and 2D show entire delamination of UBM copper.
Figure 2C:
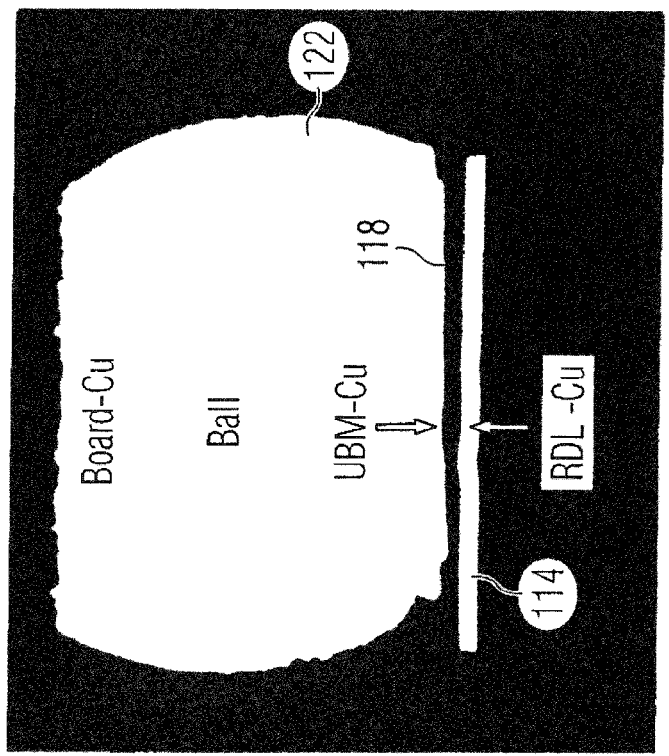

Furthermore, it may be observed, that very little adhesion exists between the UBM copper 118 and the under pad or redistribution layer (RDL) copper 104, after temperature cycling. The UBM copper 118 heaves off and delamination of UBM copper 118 on RDL copper 104 may occur as shown FIGS. 2B, 2C and 2D. FIGS. 2C and 2D show in particular the entire delamination of UBM copper 118. In other words, the TiW interface layer 112, may lead to lower adhesion, e.g. poorer adhesion, between the UBM copper 118 and RDL copper 104.

Various embodiments provide a construction, wherein phenomena such as UBM wing lift may be avoided, and which may furthermore improve adhesion between UBM copper 118 and RDL Cu 104. According to various other embodiments, UBM wing lift may be used to create a flexible UBM structure 118.

Figure 3A:
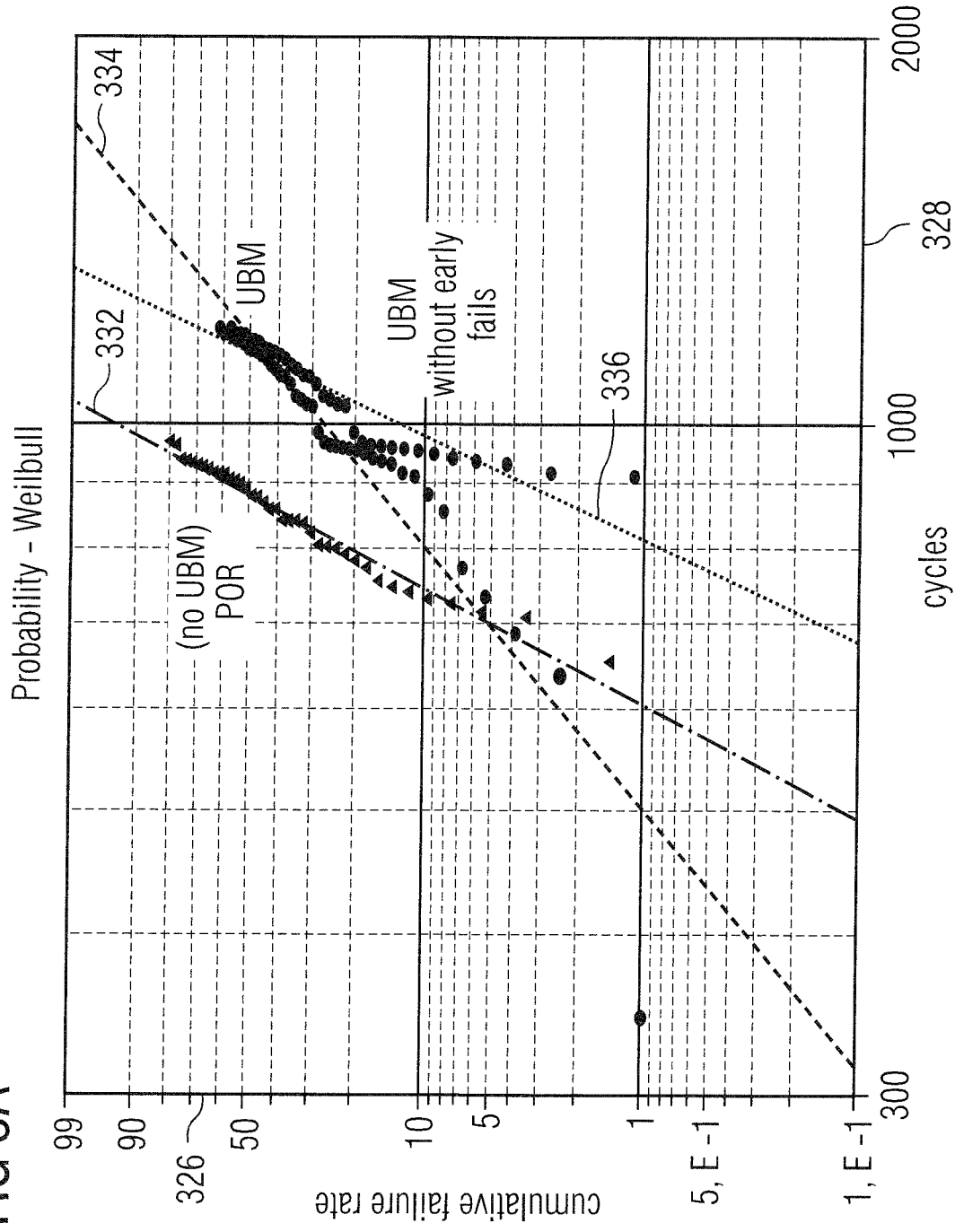
FIG. 3A show a Weibull Plot of temperature cycling on board with and without UBM according to an embodiment.
Figure 3B:
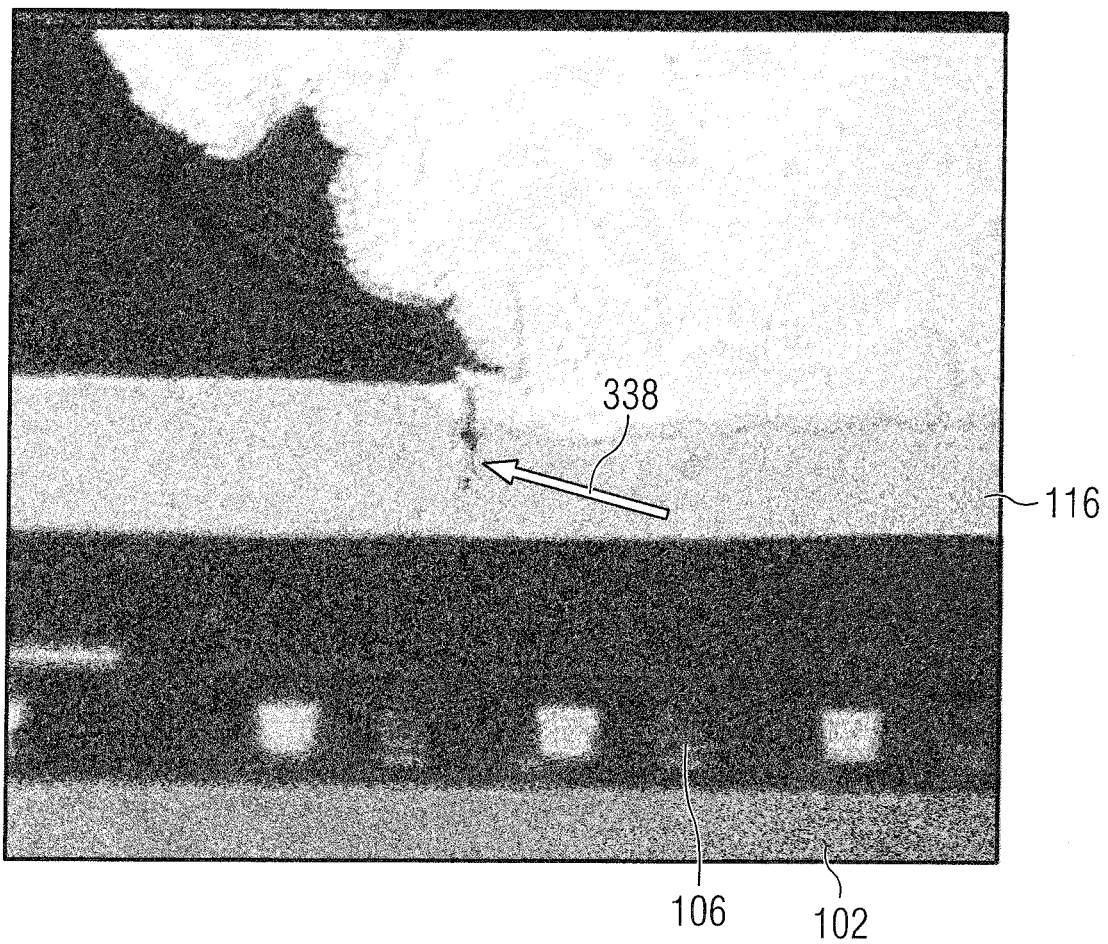
FIG. 3B shows copper tearing after temperature cycling on board without UBM.

Through the omission of the UBMs, e.g. such as UBM copper 118, neither the UBM wing lift problem, nor the adhesion problem between UBM and RDL, e.g. between UBM Cu and RD1 Cu, may occur. However, as shown in the Weibull Plot of TCOB with UBM and without UBM in FIG. 3A, omission of UBMs is further associated with a lower cycle strength TCOB. As shown in the plot of cumulative failure rate 326 versus number of cycles 328, higher failure rates at lower number of cycles occur for packages with No UBM 332, than for packages with UBMs 334, 336. Furthermore, as shown in FIG. 3B, chip packages without UBM may be at higher risk of suffering from copper tearing 338 after TCOB.

Various embodiments provide a method for manufacturing a chip package and a chip package, wherein through the omission of the bather layer, e.g. TiW, during the UBM process, there may be no interface layer between UBM and the RDL, e.g. between UBM Cu and RDL Cu.

Various embodiments provide a method for manufacturing a chip package and a chip package, wherein a homogeneous structure of the two materials, i.e. UBM and RDL, e.g. UBM Cu and RDL Cu, without an interface layer is possible. Therefore, a higher possible adhesion of the same materials may be possible.

FIG. 4 shows method 400 for manufacturing a chip package according to an embodiment.

Method 400 may include:

forming an electrically insulating material over a chip side (in 410);

selectively removing at least part of the electrically insulating material thereby forming a trench in the electrically insulating material (in 420);

depositing electrically conductive material in the trench wherein the electrically conductive material is electrically connected to at least one contact pad formed over the chip side (in 430);

forming an electrically conductive structure over the electrically insulating material, wherein at least part of the electrically conductive structure is in direct physical and electrical connection with the electrically conductive material (in 440); and depositing a joining structure over the electrically conductive structure (in 450).

FIGS. 5A to 5F show method 500 for manufacturing a chip package according to an embodiment.

Method 500 may include forming first electrically insulating layer 542 over first chip side 544.

Chip 502 may include first chip side 544 and second chip side 546.

First chip side 544 may include a chip top side, which may also be referred to as a "first side", "front side" or "upper side" of the chip. The terms "top side", "first side", "front side" or "upper side" may be used interchangeably hereinafter. Second chip side 546 may include a chip bottom side, which may also be referred to as "second side" or "back side" of the chip. The terms "second side", "back side", or "bottom side" may be used interchangeably hereinafter. It may be understood, that generally, at least one contact pad 506 may be formed over first chip side 544, e.g. directly on a chip surface on first chip side.

Chip 502 may be at least partially surrounded by mold compound 548. For example, mold compound 548 may be formed over second chip side 546 and one or more sidewalls 552 of chip 502. Generally speaking, first chip side 544 may be substantially free of mold compound as it may be the side of chip 502 which carries the at least one contact pad 506. Generally, thin passivation material (not shown) and at least one contact pad 506 may already be formed over first chip side 544, during front end processing. The thin passivation material may include e.g. polyimide, or e.g. silicon nitride, or e.g. silicon dioxide, which may be arranged between the at least one contact pad 506.

At least one contact pad 506 may include at least one material, element or alloy from the following group of materials, the group consisting of: copper, aluminum, silver, tin, gold, palladium, zinc, nickel, iron, titanium, vanadium. At least one contact pad 506 may include one or more noble metals.

Process 510 shows that first electrically insulating layer 542 may be formed over first chip side 544. First electrically insulating layer 542 may be referred to as dielectric1. First electrically insulating layer 542 may be formed over first chip side 544 and side 554 of mold compound 548. Side 554 may face a same direction as a direction which first chip side 544 faces, and side 554 may be substantially level with 544. This may be as a result from processes related to embedded wafer level packaging, wherein a plurality of chips may be arranged over a common, temporary substrate, e.g. with first chips dies faced down on the common substrate, and commonly molded with mold compound 548, which may hold together a plurality of chips. This arrangement of a mold compound 548 holding a plurality of chips may be referred to as a reconstituted wafer. It may therefore be understood that chip 502 may be one chip of a plurality of chips similarly held by mold compound 548.

First electrically insulating layer 542 may substantially cover first chip side 544 and side 554 of mold compound 548. First electrically insulating layer 542 may including a dielectric material. First electrically insulating layer 542 may include at least one material from the following group of materials, the group of materials consisting of: photosensitive dielectric, e.g. WPR; Polyimide, e.g. Durimide 7320 or low Temperature Cure Durimide 7320; polymer e.g. benzocyclobutene (BCB); epoxy. First electrically insulating layer 542 may have a thickness ranging from about 1 µm to about 50 µm, e.g. about 1 µm to about 20 µm, e.g. about 1 µm to about 10 µm. First electrically insulating layer 542 may have a thickness of about 6 µm.

Subsequently, a trench, or a hole, may be formed in first electrically insulating layer 542. Sidewalls 561 of trench 556 may be defined by sides of first electrically insulating layer 542. Trench 556 may be formed over at least one contact pad 506, such that at least one contact pad 506 may be released from first electrically insulating layer 542; in other words such that at least one contact pad 506 may be exposed.

First intermediate electrically conductive layer 558 may be deposited over, e.g. directly on, first electrically insulating layer 542; over, e.g. directly on, sidewalls 561 of trench 556;

and over, e.g. directly on, at least one contact pad 506. First intermediate electrically conductive layer 558 may include and/or be an adhesion layer, e.g. similar to adhesion layer 112, and may function e.g. as an adhesion promoter e.g. as a diffusions barrier layer and/or metal ion barrier. First intermediate electrically conductive layer 558 may include at least one of a nitride, boride or carbide of a transition metal. First intermediate electrically conductive layer 558 may include at least one material from the following group of materials, the group consisting of: titanium (Ti), titanium-tungsten (TiW), titanium nitride (TiN), tantalum nitride (TaN). First intermediate electrically conductive layer 558 may have a thickness ranging from about 15 nm to about 500 nm, e.g. from about 30 nm to about 100 nm, e.g. about 45 nm to about 55 nm. First intermediate electrically conductive layer 558 may have a thickness of about 50 nm. At least part of first intermediate electrically conductive layer 558 may be in directly physical and electrical contact with at least one contact pad 506 formed over first chip side 544.

Subsequently, first electrically conductive layer 504 may be formed over a first intermediate electrically conductive layer 542. First electrically conductive layer 504 may be electrically connected to at least one contact pad 506 via the first intermediate electrically conductive layer 558. First electrically conductive layer 504 may be referred to as a redistribution layer (RDL), e.g. RDL Cu. First electrically conductive layer 504 may include at least one material, element or alloy from the following group of materials, the group consisting of: copper, aluminum, silver, tin, gold, palladium, zinc, nickel, iron. First electrically conductive layer 504 may have a thickness ranging from about 1 µm to about 50 µm, e.g. about 1 µm to about 20 µm, e.g. about 1 µm to about 10 µm. First electrically conductive layer 504 may have a thickness of about 6 µm. First electrically conductive layer 504 may be formed over, e.g. directly on, first intermediate electrically conductive layer 542, and further in trench 556. For example, first electrically conductive layer 504 may substantially fill trench 556 and therefore be in electrical connection with at least one contact pad 506. First electrically conductive layer 504 may be deposited and optionally further processed, such that first electrically conductive layer 504 may be formed substantially level over first intermediate electrically conductive layer 558.

Subsequently, electrically insulating material 524, e.g. dielectric2, may be further formed over first chip side 544. For example, electrically insulating material 524 may be formed over, e.g. directly on, first electrically conductive layer 504. Electrically insulating material 524 may be formed over at least one contact pad 506 formed over first chip side 544. Electrically insulating material 524 may be formed over first chip side 544, wherein the electrically insulating material 524 may include and/or be the upper-most electrically insulating layer formed over first chip side 544. Electrically insulating material 524 may be formed over one or more electrically conductive layers, e.g. 558, e.g. 504, electrically connected to at least one contact pad 506 formed over first chip side 544.

Electrically insulating material 524 may be similar to first electrically insulating layer 542. Electrically insulating material 524 may include a dielectric material. Electrically insulating material 524 may include at least one material from the following group of materials, the group of materials consisting of: photosensitive dielectric, e.g. WPR; Polyimide, e.g. Durimide 7320 or low Temperature Cure Durimide 7320; polymer e.g. benzocyclobutene (BCB); epoxy. Electrically insulating material 524 may have a thickness ranging from about 1 µm to about 50 µm, e.g. about 1 µm to about 20 µm, e.g. about 1 µm to about 10 µm. Electrically insulating material 524 may have a thickness of about 6 µm.

Subsequently, at least part of the electrically insulating material 524 may be selectively removed, thereby forming trench 562 in electrically insulating material 524. One or more portions of one or more electrically conductive layers, e.g. 504, may be released from electrically insulating material 524. For example, portion 564 of first electrically conductive layer 504 may be exposed due to the selective removal of part of electrically insulating material 524. At least part of the electrically insulating material 524 may be selectively removed by at least one method from the following group of methods, the group of methods consisting of: drilling, laser drilling, etching, ion-milling, development. Development may be used to remove at least part of electrically insulating material 524 wherein electrically insulating material includes a photosensitive dielectric material.

Figure 5A:
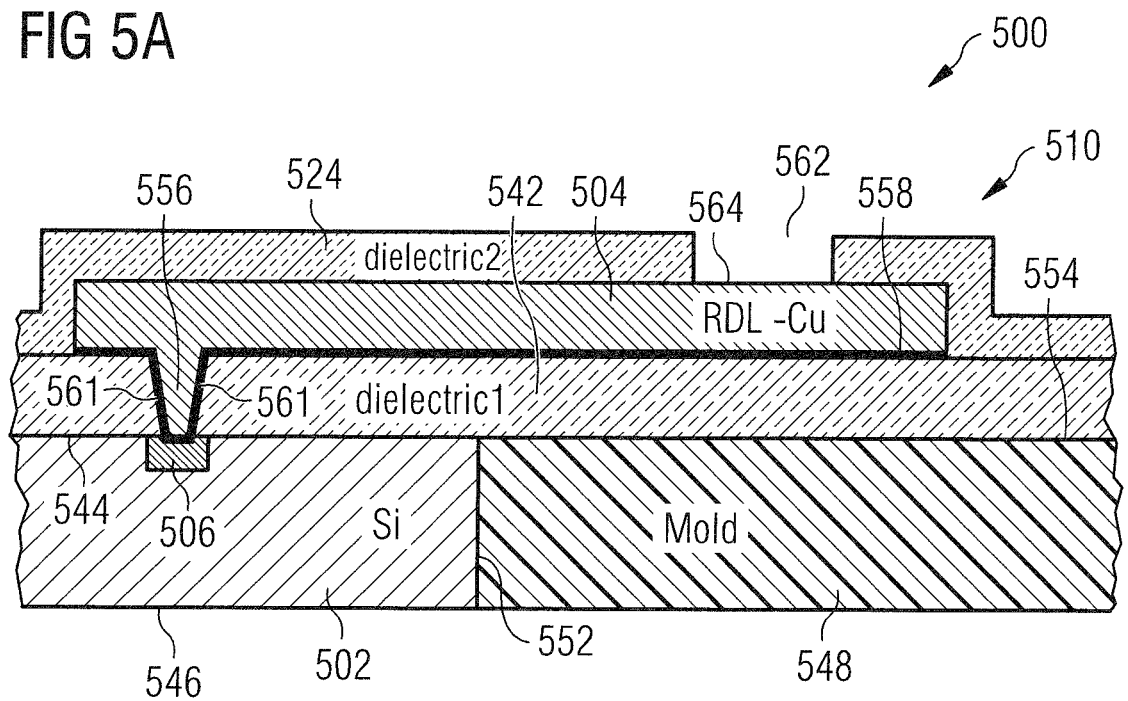
FIGS. 5A to 5G show a method for manufacturing a chip package according to an embodiment.
Figure 5B:
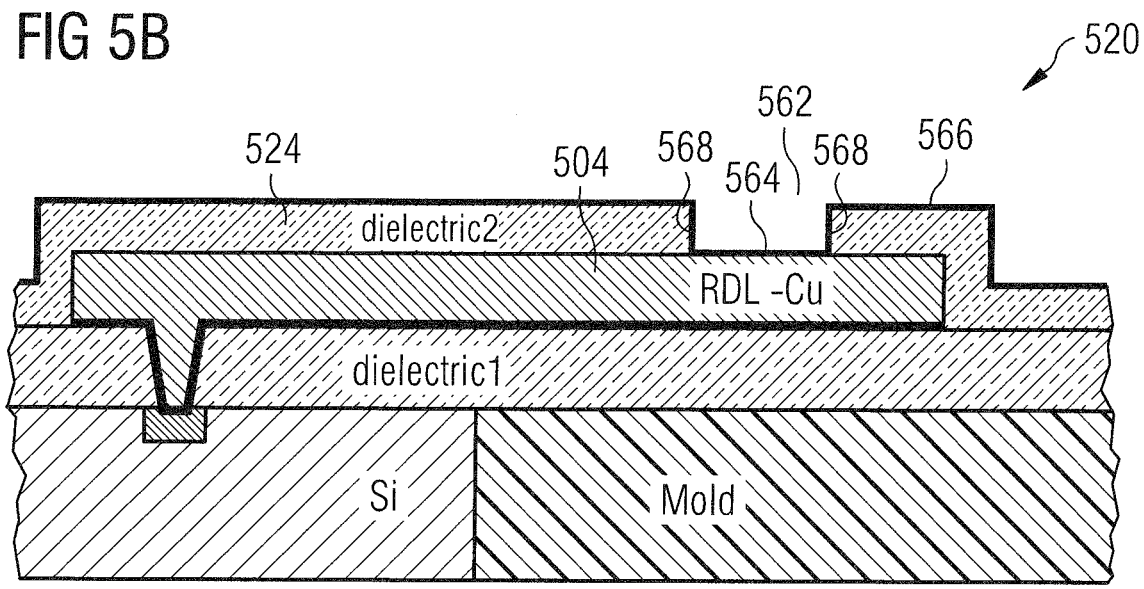

As shown in FIG. 5B, process 520, optional seed layer 566 may be formed over electrically insulating material 524. Seed layer 566 may in addition, be continuously formed over exposed portion 564 of first electrically conductive layer 504 and one or more sidewalls 568 of trench 562. Seed layer 566 may be used as a growth seed layer for electrically conductive material which may be electrically contacted to first electrically conductive layer 504 via seed layer 566. Seed layer 566 may be electrically conductive, and may be formed from the same material as first electrically conductive layer 504. This may be allow for any subsequent material deposition using seed layer 566 as a seed growth layer to be of the same material as first electrically conductive layer 504. Seed layer 566 may be used, in particular, as a seed layer for galvanic deposition of electrically conductive material 516 and electrically conductive structure 518. Seed layer 566 may have a thickness ranging from about 15 nm to about 500 nm, e.g. from about 30 nm to about 100 nm, e.g. about 45 nm to about 55 nm. Seed layer 566 may have a thickness of about 50 nm.

In order to selectively deposit electrically conductive material in selected areas of the chip package, photolithography may be used to define these selective areas.

Figure 5C:
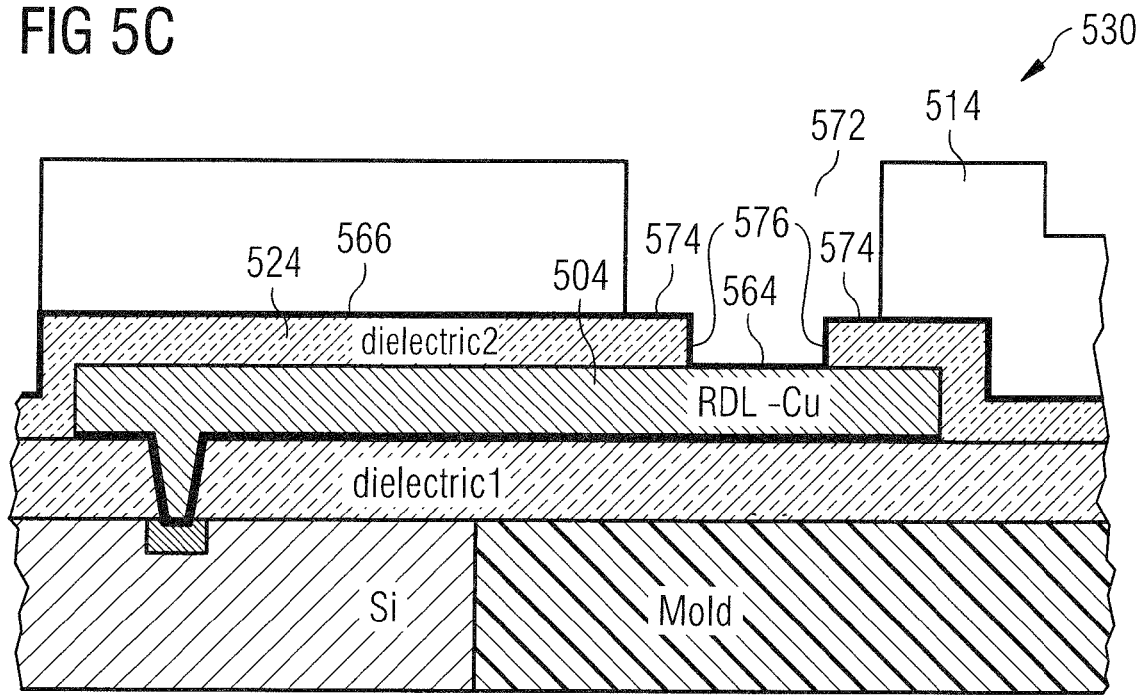

As shown in FIG. 5C, process 530, resist 514 may be deposited over electrically insulating material 524 and selectively patterned. In case of no seed layer 566, such that portion 564 of first electrically conductive layer 504 may be exposed and/or at least part of electrically insulating material 524, e.g. part 574 of top surface of electrically insulating material 524 and sidewalls 576 of electrically insulating material 524, may optionally also be released from resist 514. In case of seed layer 566 is used as a growth layer, part of seed layer 566 formed over portion 564, and/or parts of seed layer 566 formed over part 574 of top surface of electrically insulating material 524 and sidewalls 576 of electrically insulating material 524, may be released from resist 514.

Figure 7A:
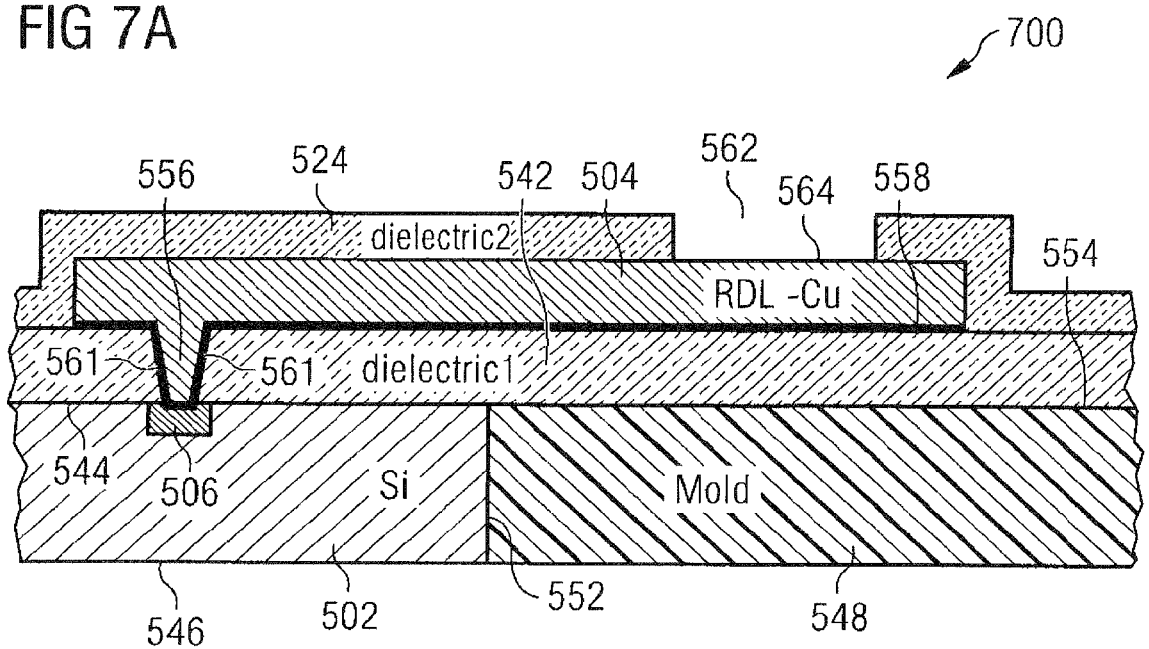
FIGS. 7A to 7D show a method for manufacturing a chip package according to an embodiment.
Figure 7B:
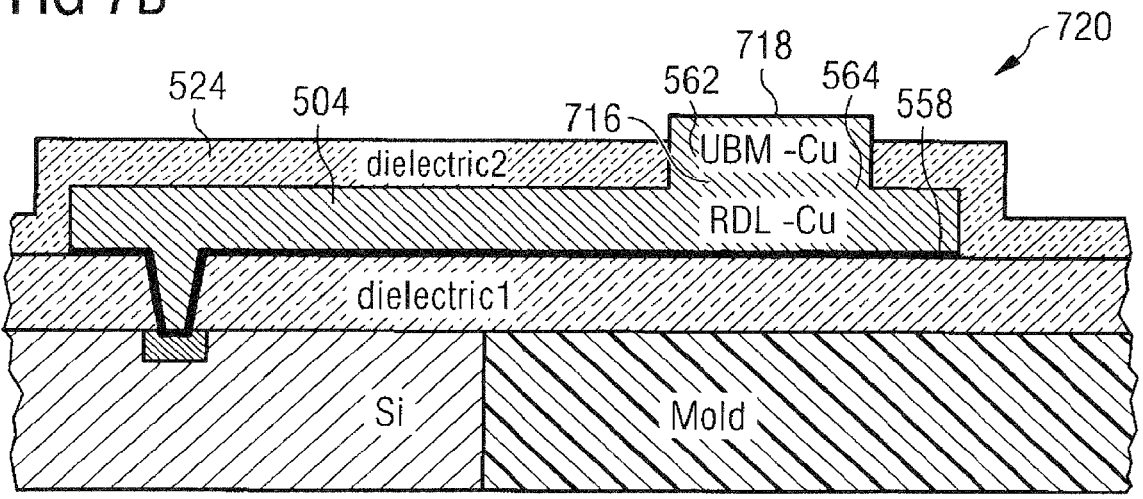
Figure 7C:
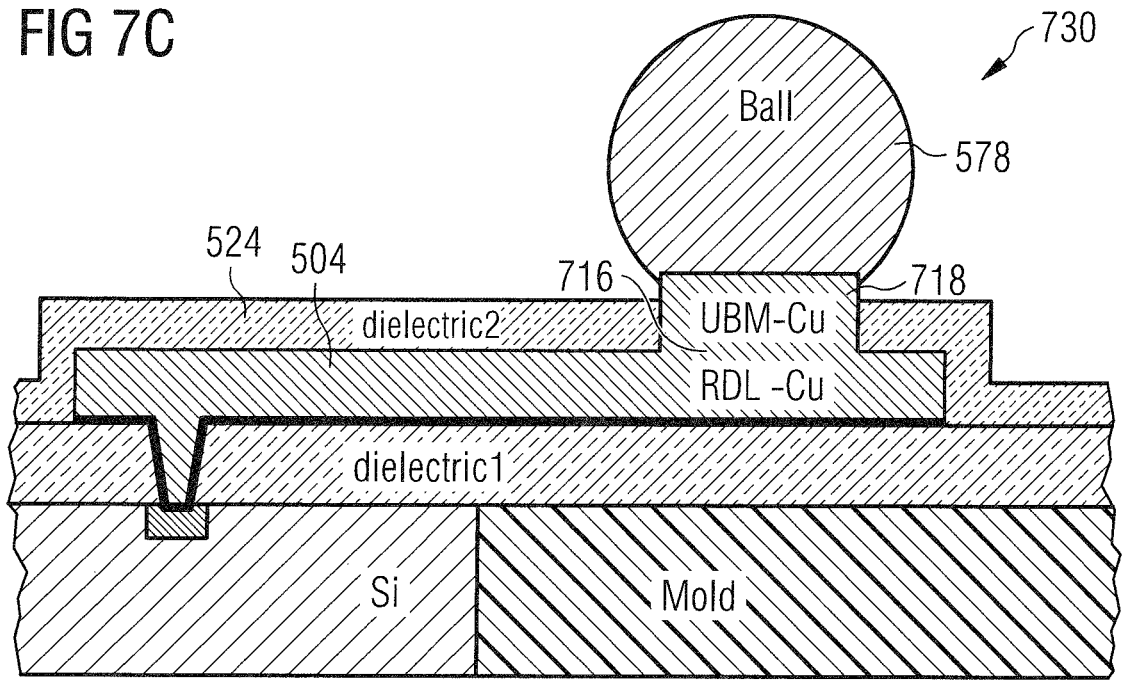
Figure 7D:
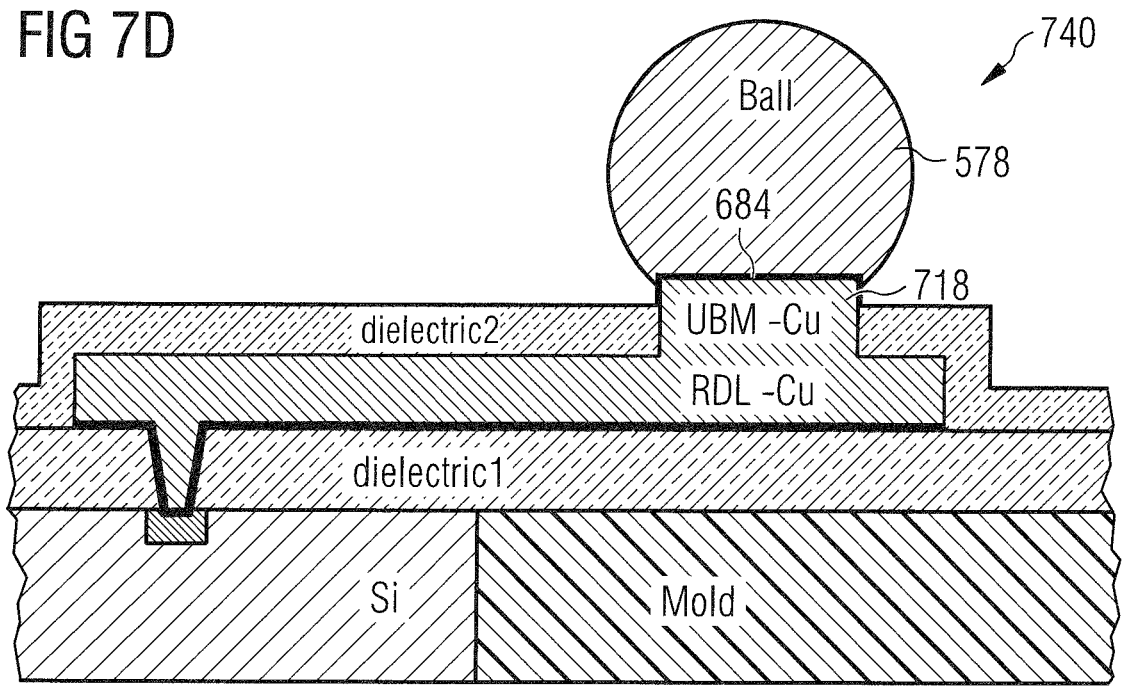
Figure 8:
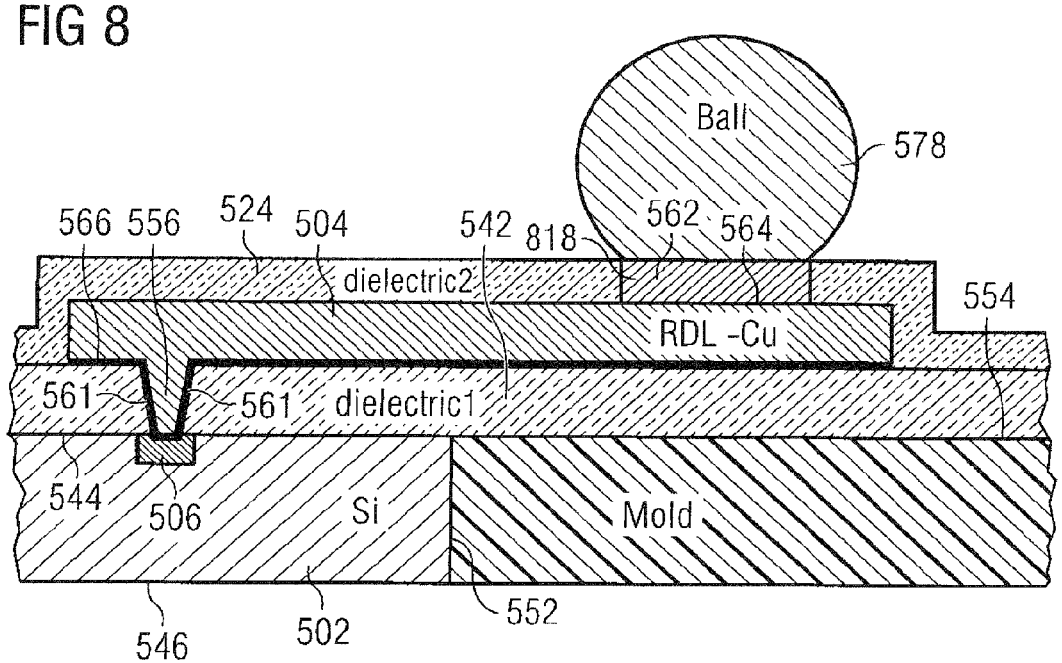
FIG. 8 shows a method for manufacturing a chip package according to an embodiment.

FIGS. 7, 8 and 9 show various other embodiments wherein top surfaces 574 are not released from resist 514.

Figure 5D:
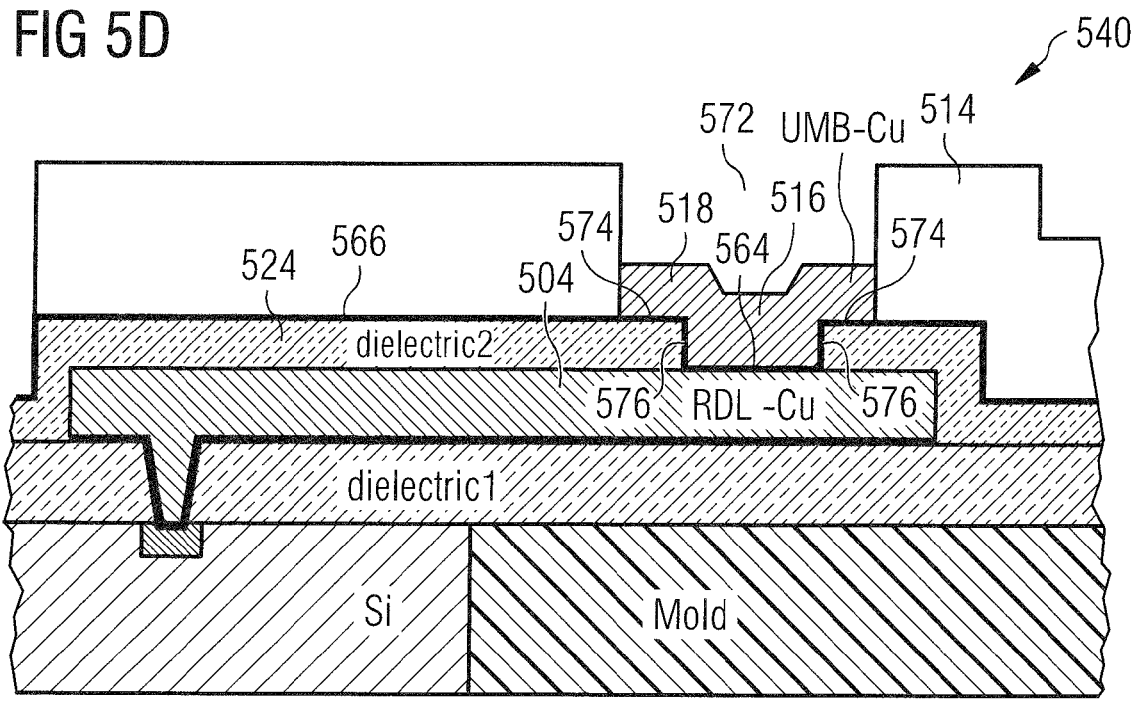

As shown in FIG. 5D, process 540, using the selectively patterned resist 514 as a deposition mask, electrically conductive material 516 may be deposited in trench 572. For example, trench 572 may be at least partially filled with electrically conductive material 516. Electrically conductive material 516 may be electrically connected to at least one contact pad formed over the chip side. Furthermore, electrically conductive material 516 may be deposited such that electrically conductive material is further formed over surfaces 574 and sidewalls 576 of electrically insulating material 524. The electrically conductive material 516 in trench 572 and over surfaces 574 and sidewalls 576 of electrically insulating material 524 may be referred to as electrically conductive structure 518. Electrically conductive material 516 may be deposited on the one or more portions 564 of one or more electrically conductive layers, e.g. of first electrically conductive layer 504, selectively released from electrically insulating material 524.

Electrically conductive structure 518 may be formed over electrically insulating material 524, wherein at least part of electrically conductive structure 518 may be in direct physical and electrical connection with electrically conductive material 516.

It may be understood that electrically conductive structure 518 including electrically conductive material 516 may be optionally grown from seed layer 566. In other words, electrically conductive structure 518 including electrically conductive material 516 which may optionally be grown from seed layer 556, e.g. from galvanic deposition, may be in direct physical and electrical connection with electrically conductive material 504. Even if galvanic deposition is not selected as a deposition method, the deposited electrically conductive structure 518, including electrically conductive material 516 may be formed such that it may be in direct physical and electrical connection with electrically conductive material 504.

Electrically conductive structure 518, including electrically conductive material 516 may include at least one material, element or alloy from the following group of materials, the group consisting of: copper, nickel, nickel doped copper, titanium, titanium carbide, tungsten, tungsten carbide, hafnium oxide, iridium oxide. Electrically conductive structure 518 may generally include electrically conductive metals, or electrically conductive carbides, or electrically conductive oxides. Other materials may also be used for electrically conductive structure 518, e.g. the UBM, however, they may be considered in terms of complexity and additional costs which may be incurred for example, costs associated with bather deposition by chemical vapor deposition (CVD) or atomic layer deposition (ALD).

Electrically conductive structure 518 may include an under bump metallization (UBM) structure, formed over electrically insulating material 524, wherein at least part of electrically conductive structure 518 may be in direct physical and electrical connection with electrically conductive material 504. Electrically conductive structure 518, including electrically conductive material 516 may include the same material. Furthermore, electrically conductive structure 518, including electrically conductive material 516 may include the same material as electrically conductive material 504.

Figure 5E:
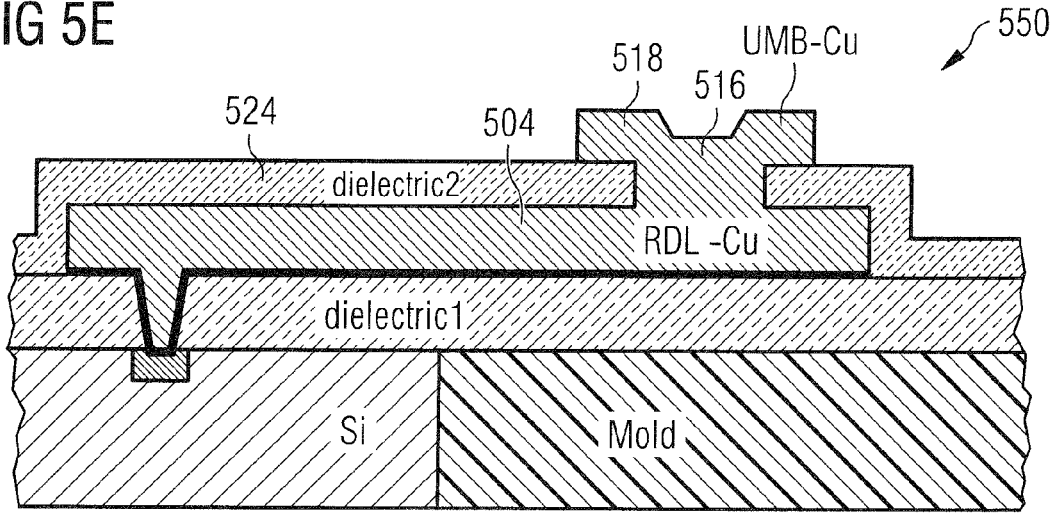

As shown in FIG. 5E, process 550, patterned resist 514 may be removed. Furthermore, other portions of seed layer 566 below resist 514 may be removed.

Figure 5F:
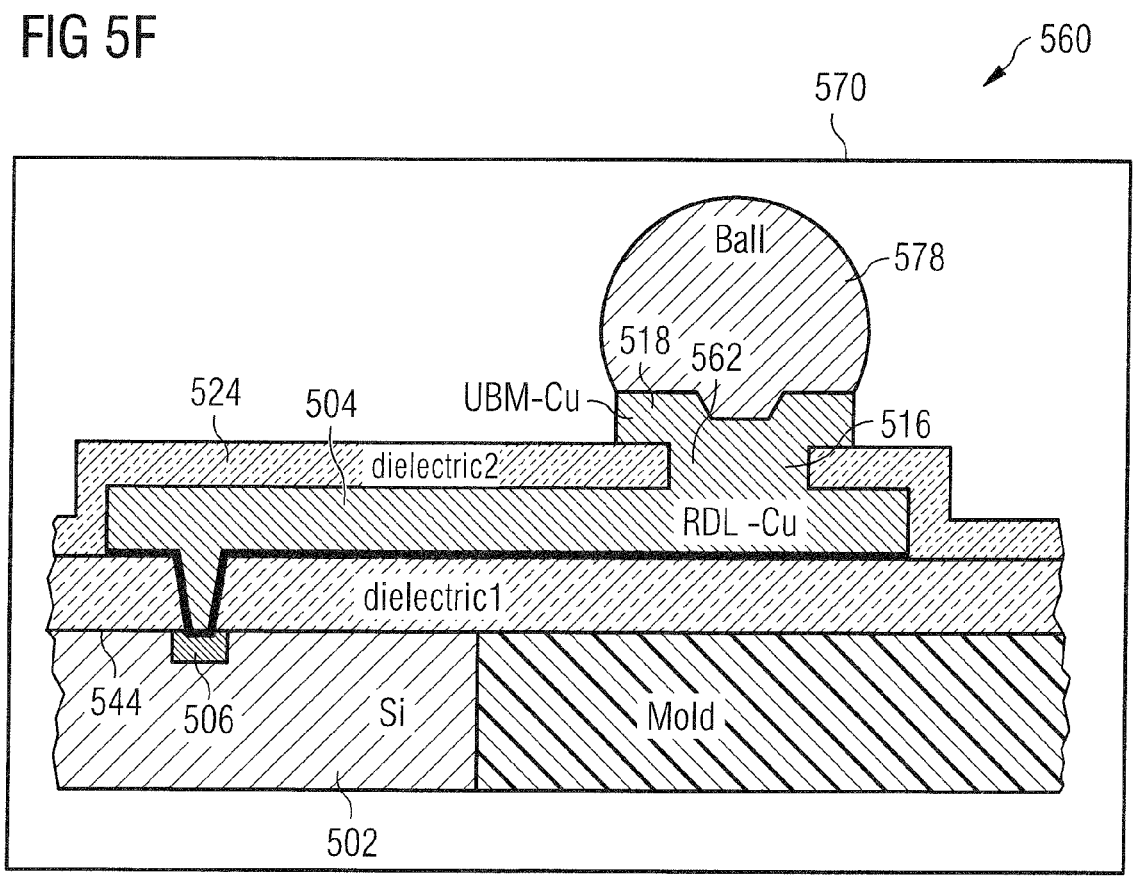

As shown in FIG. 5F, process 560, joining structure 578 may be deposited over electrically conductive structure 518. Joining structure 578 may include a solder structure. Joining structure 578 may include at least one joining structure from the following group of joining structures, the group of joining structures consisting of: a solder ball, a solder bump.

Electrically conductive structure 518 may include the same material as electrically conductive material 516, and joining structure 578 may be in direct physical and electrical contact with electrically conductive structure 518. Electrically conductive structure 518 may include at least one material from the following group of materials, the group consisting of: nickel phosphide (NiP), nickel phosphide-palladium-gold (NiP—Pd—Au).

Joining structure 578 may include at least one material, element or alloy from the following group of materials, the group consisting of: silver, zinc, tin, indium, copper, gold, palladium, lead.

A chip package, such as chip package 570, may be manufactured according to various embodiments of method 500. Chip package 570 may include: electrically insulating material 524 formed over chip side 544; trench 562 formed in electrically insulating material 524; electrically conductive material 516 deposited in trench 562 wherein electrically conductive material 516 may be electrically connected to at least one contact pad 506 formed over chip side 544; electrically conductive structure 518 formed over electrically insulating material 524, wherein at least part of electrically conductive structure 518 may be in direct physical and electrical connection with electrically conductive material 516; and joining structure 578 formed over electrically conductive structure 518.

It may be understood that physical adhesion between electrically conductive structure 518 and first electrically conductive layer 504 may be better than adhesion between electrically conductive structure 518 and electrically insulating material 524.

Figure 5G:
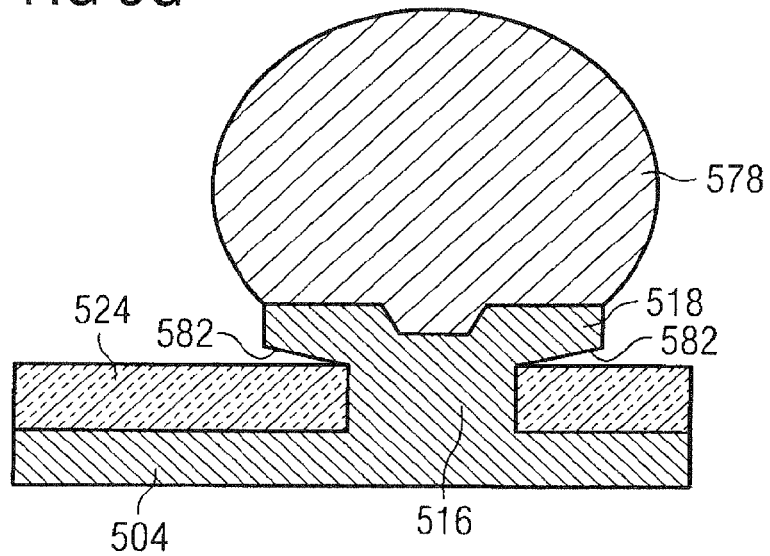

With traditional chip packages, UBM wing lift due to delamination of UBM copper from the dielectric layer, and delamination of the UBM from RDL copper, are generally not tolerated or desired. FIG. 5G shows part of a chip package according to various embodiments, wherein due to the excellent adhesion between electrically conductive structure 518 and first electrically conductive layer 504, at least a further part 582 of electrically conductive structure 518 may be separated from electrically insulating material 524, e.g. similar to UBM wing lift. Further part 582 may include and/or be a flexible portion of electrically conductive structure 518, which may improve the thermal reliability of the chip package due to flexibility of the electrically conductive structure 518. Electrically conductive structure 518 may therefore be understood to include part which may be substantially rigid, e.g. electrically conductive material 516, and a further part 582 which may be more flexible than the substantially rigid part. For example, electrically conductive structure 518 may include electrically conductive material 516 in direct physical and electrical connection with first electrically conductive layer 504, and a further part 582 arranged over electrically insulating material 524 which may be better adhered to electrically conductive material 516 than to electrically insulating material 524. Further part 582 may be arranged between joining structure 578 and electrically conductive material 516. Furthermore, as joining structure 578 may be physically and electrically connected to electrically conductive material 516 via further part 582, lateral movement of further part 582 and joining structure 578 may therefore be achieved, without impacting the excellent adhesion between electrically conductive material 516 and first electrically conductive layer 504.

Through the omission of the TiW bather layer by UBM procession, and the use of electroless processes, new possibilities and variations may be produced.

Figure 6:
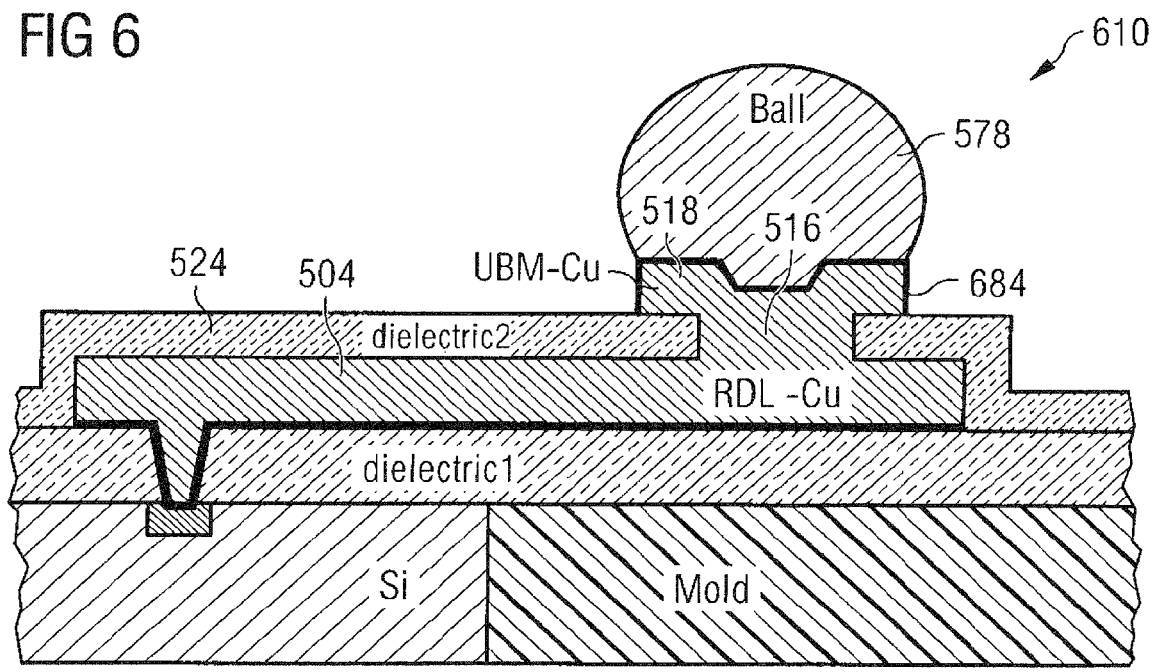
FIG. 6 shows a method for manufacturing a chip package according to an embodiment.

FIG. 6 shows chip package 610 according to an embodiment. Chip package 610 may be manufactured according to method 500; however may further include the following process: forming layer 684 over electrically conductive structure 518, e.g. before depositing joining structure 578, and subsequently forming joining structure 578 over layer 684. Layer 684 may include at least one material from the following group of materials, the group consisting of: nickel-phosphide. Layer 684 may have a thickness ranging from about 2 µm to about 20 µm, e.g. from about 2 µm to about 50 µm, e.g. from about 4 µm to about 6 µm. Layer 684 may have a thickness of about 5 µm. Layer 684 may be deposited by electroless plating. According to other embodiments, layer 684 may be deposited by at least one deposition method from the following group of deposition methods, the group of deposition methods consisting of: electrochemical plating, electroless deposition, sputter processes, chemical vapor deposition, thermal evaporation.

FIGS. 7A to 7C show method 700 for manufacturing a chip package according to an embodiment. Method 700 may include one or more of the processes already described with respect to Method 500. In Method 700, however, electrically conductive structure 718 (analogous to electrically conductive structure 518), may be deposited by electroless methods. Therefore, method 700 may include one or more or all of the processes and features already described with respect to process 510. However, seed layer 566 may not be needed for the deposition of electroless electrically conductive structure 718, and may be omitted.

As shown in FIG. 7B, process 720, electrically conductive structure 718 may be deposited electrolessly over portion 564 of first electrically conductive layer 504, e.g. in direct physical and electrical connection with portion 564. Part of electrically conductive structure 718, e.g. electrically conductive material 716 (which may be analogous to electrically conductive material 516), may be formed in trench 562, and in direct physical and electrical connection with portion 564. Electrically conductive structure 718 may be thicker than the height of trench 562, and may form a protrusion out of trench 562. Due to electroless deposition without seed layer 566, the overhanging portions of electrically conductive structure 518 which are formed over part 574 of top surface of electrically insulating material 524, may not be present in electrically conductive structure 718. Furthermore, through an electroless process, the Cu layer, e.g. electrically conductive material 716 and eventually electrically conductive structure 718 may be deposited, directly after the processing of the pads, e.g. copper pads and electrically insulating material 524, e.g. dielectric 2. Therefore, the process sequence may be further simplified, so that to manufacture the UBM metallization, lithography may no longer be necessary.

Electroless deposition of copper may be carried out according to the following process steps: cleaning, micro-etching, activation, copper deposition, rinsing and drying.

Electroless solutions may include: a source of metal ions, a reducing agent, e.g. formaldehyde, a complexant to keep the metal ions in solution, a pH buffer and optionally other chemicals Electroless deposition temperatures may range from between 25° C. to about 90° C.

Electroless deposition times may range from about 1 min to about 60 minutes.

Filtration may be carried out to remove larger particles.

As shown in FIG. 7C, process 730, which may be analogous to process 560, joining structure 578 may be deposited over electrically conductive structure 718.

As shown in another embodiment in FIG. 7D, process 740, layer 684 may be formed over electrically conductive structure 718, e.g. before depositing joining structure 578. In other words, for example, after the electroless formation of electrically conductive structure 718, e.g. which may include UBM copper, a hard electroless layer 684, e.g. NiMo layer, may follow. Subsequently, joining structure 578 may be formed over layer 684. Layer 684 may include at least one material from the following group of materials, the group consisting of: nickel phosphide (NiP), nickel phosphide-palladium-gold (NiP—Pd—Au).

Through layer 684, e.g. NiMo, as described with regards to embodiments in FIG. 6 and FIG. 7D, a further stabilisation of electrically conductive structure 518, 718, e.g. a copper structure, may be produced against mechanical forces, e.g. temperature cycling.

FIG. 8 shows method 800 for manufacturing a chip package according to an embodiment. Method 800 may include one or more of the processes already described with respect to methods 500, 600, 700.

In particular, as shown in FIG. 8, electrically conductive structure 818 may be deposited by electroless deposition and may include at least one material from the following group of materials, the group consisting of: nickel phosphide (NiP), nickel phosphide-palladium-gold (NiP—Pd—Au). Electrically conductive structure 818 may differ from electrically conductive structure 518 and electrically conductive structure 718 in that electrically conductive structure 818 may be formed substantially within trench 562. That is, electrically conductive structure 818 and top surface, e.g. part 574 of top surfaces of electrically insulating material 524, may be substantially level. Electrically conductive structure 818 may include a deposited stable electroless layer, e.g. similar to layer 684, layer. In other words, a UBM copper structure may be completely omitted.

Although it has been shown so far according to various embodiments that electrically conductive structure 518 or 718 or 818 may be formed over a redistribution layer RDL, e.g. over first electrically conductive layer 504, it may be understood that according to other embodiments, for example, wherein redistribution layers are not used or deposited, electrically conductive structure 518 or 718 or 818 may be formed over a contact pad 506. For example, electrically conductive structure 518, or 718 or 818 may be in direct physical and electrical connection with contact pad 506. For example, electrically conductive structure 518, or 718 or 818 may be formed in trench 556 and over first electrically insulating layer 542, e.g. dielectric1, wherein first electrically insulating layer 542, e.g. dielectric1, may be formed directly on first chip side 544, and may also be the upper-most electrically insulating layer formed over first chip side 544.

It may be understood that chip packages manufactured according to various embodiments described above may include wafer level packages (WLP), which may include packages according to fan-in and/or fan-out technologies.

Various embodiments provide a method for manufacturing a chip package, the method including: forming an electrically insulating material over a chip side; selectively removing at least part of the electrically insulating material thereby forming a trench in the electrically insulating material; depositing electrically conductive material in the trench wherein the electrically conductive material is electrically connected to at least one contact pad formed over the chip side; forming an electrically conductive structure over the electrically insulating material, wherein at least part of the electrically conductive structure is in direct physical and electrical connection with the electrically conductive material; and depositing a joining structure over the electrically conductive structure.

According to an embodiment, forming an electrically insulating material over a chip side includes forming a dielectric layer over a chip side.

According to an embodiment, forming an electrically insulating material over a chip side includes forming an electrically insulating material over at least one contact pad formed over the chip side.

According to an embodiment, forming an electrically insulating material over a chip side includes forming an electrically insulating material including at least one material from the following group of materials, the group of materials consisting of: photosensitive dielectric, Polyimide, polymers, benzocyclobutene (BCB), epoxy.

According to an embodiment, forming an electrically insulating material over a chip side includes forming an electrically insulating material directly on the chip side.

According to an embodiment, forming an electrically insulating material over a chip side includes forming an electrically insulating material over the chip side, wherein the electrically insulating material includes the upper-most electrically insulating layer formed over the chip side.

According to an embodiment, forming an electrically insulating material over a chip side includes forming an electrically insulating material over a first electrically conductive layer formed over the chip side; wherein the first electrically conductive layer is formed over a first intermediate electrically conductive layer, wherein the first intermediate electrically conductive layer is formed over a first electrically insulating layer; wherein at least part of the first intermediate electrically conductive layer is in directly physical and electrical contact with at least one contact pad formed over the chip side; and wherein the first electrically conductive layer is electrically connected to the at least one contact pad via the first intermediate electrically conductive layer.

According to an embodiment, the first electrically conductive layer includes at least one material, element or alloy from the following group of materials, the group consisting of: copper, aluminum, silver, tin, gold, palladium, zinc, nickel, iron.

According to an embodiment, the first intermediate electrically conductive layer may include at least one of a nitride, boride or carbide of a transition metal.

According to an embodiment, forming an electrically insulating material over a chip side includes forming an electrically insulating material over one or more electrically conductive layers electrically connected to at least one contact pad formed over the chip side.

According to an embodiment, selectively removing at least part of the electrically insulating material thereby forming a trench in the electrically insulating material further includes selectively releasing one or more portions of the one or more electrically conductive layers from the electrically insulating material.

According to an embodiment, selectively removing at least part of the electrically insulating material includes selectively removing at least part of the electrically insulating material by at least one method from the following group of methods, the group of methods consisting of: drilling, laser drilling, etching, ion-milling, development.

According to an embodiment, depositing electrically conductive material in the trench wherein the electrically conductive material is electrically connected to at least one contact pad formed over the chip side includes depositing electrically conductive material on the one or more portions of the one or more electrically conductive layers selectively released from the electrically insulating material.

According to an embodiment, depositing electrically conductive material in the trench wherein the electrically conductive material is electrically connected to at least one contact pad formed over the chip side includes at least partially filling the trench with electrically conductive material.

According to an embodiment, the electrically conductive material includes at least one material, element or alloy from the following group of materials, the group consisting of: copper, nickel, nickel doped copper, titanium, titanium carbide, tungsten, tungsten carbide, hafnium oxide, iridium oxide.

According to an embodiment, forming an electrically conductive structure over the electrically insulating material, wherein at least part of the electrically conductive structure is in direct physical and electrical connection with the electrically conductive material includes forming an electrically conductive structure including a under bump metallization structure over the electrically insulating material, wherein at least part of the electrically conductive structure is in direct physical and electrical connection with the electrically conductive material.

According to an embodiment, forming an electrically conductive structure over the electrically insulating material, wherein at least part of the electrically conductive structure is in direct physical and electrical connection with the electrically conductive material includes forming an electrically conductive structure including the same material as the electrically conductive material over the electrically insulating material, wherein at least part of the electrically conductive structure is in direct physical and electrical connection with the electrically conductive material.

According to an embodiment, depositing a joining structure over the electrically conductive structure includes depositing at least one joining structure from the following group of joining structures over the electrically conductive structure, the group of joining structures consisting of: a solder ball, a solder bump.

According to an embodiment, the electrically conductive structure includes the same material as the electrically conductive material, and wherein the joining structure is in direct physical and electrical contact with the electrically conductive structure.

According to an embodiment, the joining structure is in direct physical and electrical contact with the electrically conductive structure, and wherein the electrically conductive structure includes at least one material from the following group of materials, the group consisting of: nickel phosphide (NiP), nickel phosphide-palladium-gold (NiP—Pd—Au).

According to an embodiment, the joining structure includes at least one material, element or alloy from the following group of materials, the group consisting of: silver, zinc, tin, indium, copper, gold, palladium, lead.

According to an embodiment, forming an electrically conductive structure over the electrically insulating material, wherein at least part of the electrically conductive structure is in direct physical and electrical connection with the electrically conductive material further includes forming the electrically conductive structure wherein physical adhesion between the electrically conductive structure and the first electrically conductive layer is better than adhesion between the electrically conductive structure and the electrically insulating material.

According to an embodiment, forming an electrically conductive structure over the electrically insulating material, wherein at least part of the electrically conductive structure is in direct physical and electrical connection with the electrically conductive material further includes forming the electrically conductive structure, wherein at least a further part of the electrically conductive structure is separated from electrically insulating material.

According to an embodiment, the method further includes forming a layer over the electrically conductive structure and subsequently forming the joining structure over the layer.

According to an embodiment, the layer includes at least one material from the following group of materials, the group consisting of: nickel phosphide (NiP), nickel phosphide-palladium-gold (NiP—Pd—Au), Various embodiments provide a chip package, including: an electrically insulating material formed over a chip side; a trench formed in the electrically insulating material, electrically conductive material deposited in the trench wherein the electrically conductive material is electrically connected to at least one contact pad formed over the chip side; an electrically conductive structure formed over the electrically insulating material, wherein at least part of the electrically conductive structure is in direct physical and electrical connection with the electrically conductive material; and a joining structure formed over the electrically conductive structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a chip package, the method comprising:
   forming an electrically insulating material over a chip side;
   selectively removing at least part of the electrically insulating material thereby forming a trench in the electrically insulating material;
   depositing electrically conductive material in the trench wherein the electrically conductive material is electrically connected to at least one contact pad formed over the chip side;
   forming an electrically conductive structure over the electrically insulating material, said conductive structure comprising a first electrically conductive layer and a under bump metallization structure which are homogeneously integrated;
   wherein at least part of the electrically conductive structure is in direct physical and electrical connection with the electrically conductive material; and
   depositing a joining structure over the electrically conductive structure.

2. The method according to claim 1,
   wherein forming an electrically insulating material over a chip side comprises forming a dielectric layer over a chip side.

3. The method according to claim 1,
   wherein forming an electrically insulating material over a chip side comprises forming an electrically insulating material over at least one contact pad formed over the chip side.

4. The method according to claim 1,
   wherein forming an electrically insulating material over a chip side comprises forming an electrically insulating material comprising at least one material from the following group of materials, the group of materials consisting of: photosensitive dielectric, Polyimide, polymers, benzocyclobutene (BCB), epoxy.

5. The method according to claim 1,
   wherein forming an electrically insulating material over a chip side comprises forming an electrically insulating material directly on the chip side.

6. The method according to claim 1,
   wherein forming an electrically insulating material over a chip side comprises forming an electrically insulating material over the chip side, wherein the electrically insulating material comprises the upper-most electrically insulating layer formed over the chip side.

7. The method according to claim 1,
   wherein forming an electrically insulating material over a chip side comprises forming an electrically insulating material over the first electrically conductive layer formed over the chip side;
   wherein the first electrically conductive layer is formed over a first intermediate electrically conductive layer, wherein the first intermediate electrically conductive layer is formed over a first electrically insulating layer;
   wherein at least part of the first intermediate electrically conductive layer is in directly physical and electrical contact with at least one contact pad formed over the chip side; and wherein
   the first electrically conductive layer is electrically connected to the at least one contact pad via the first intermediate electrically conductive layer.

8. The method according to claim 7,
   wherein the first electrically conductive layer comprises at least one material, element or alloy from the following group of materials, the group consisting of: copper, aluminum, silver, tin, gold, palladium, zinc, nickel, iron.

9. The method according to claim 7, wherein the first intermediate electrically conductive layer comprises at least one material from the following group of materials, the group consisting of a nitride, boride or carbide of a transition metal.

10. The method according to claim 1,
    wherein forming an electrically insulating material over a chip side comprises forming an electrically insulating material over one or more electrically conductive layers electrically connected to at least one contact pad formed over the chip side.

11. The method according to claim 10,
    wherein selectively removing at least part of the electrically insulating material thereby forming a trench in the electrically insulating material further comprises selectively releasing one or more portions of the one or more electrically conductive layers from the electrically insulating material.

12. The method according to claim 11,
    wherein depositing electrically conductive material in the trench wherein the electrically conductive material is electrically connected to at least one contact pad formed over the chip side comprises
    depositing electrically conductive material on the one or more portions of the one or more electrically conductive layers selectively released from the electrically insulating material.

13. The method according to claim 1,
    wherein selectively removing at least part of the electrically insulating material comprises selectively removing at least part of the electrically insulating material by at least one method from the following group of methods, the group of methods consisting of: drilling, laser drilling, etching, ion-milling.

14. The method according to claim 1,
    wherein depositing electrically conductive material in the trench wherein the electrically conductive material is electrically connected to at least one contact pad formed over the chip side comprises
    at least partially filling the trench with electrically conductive material.

15. The method according to claim 1,
wherein the electrically conductive material comprises at least one material, element or alloy from the following group of materials, the group consisting of: copper, nickel, nickel doped copper, titanium, titanium carbide, tungsten, tungsten carbide, hafnium oxide, iridium oxide.

16. The method according to claim 1,
wherein forming an electrically conductive structure over the electrically insulating material, wherein at least part of the electrically conductive structure is in direct physical and electrical connection with the electrically conductive material comprises
forming an electrically conductive structure comprising a under bump metallization structure over the electrically insulating material, wherein at least part of the electrically conductive structure is in direct physical and electrical connection with the electrically conductive material.

17. The method according to claim 1,
wherein forming an electrically conductive structure over the electrically insulating material, wherein at least part of the electrically conductive structure is in direct physical and electrical connection with the electrically conductive material comprises
forming an electrically conductive structure comprising the same material as the electrically conductive material over the electrically insulating material, wherein at least part of the electrically conductive structure is in direct physical and electrical connection with the electrically conductive material.

18. The method according to claim 1,
wherein depositing a joining structure over the electrically conductive structure comprises depositing at least one joining structure from the following group of joining structures over the electrically conductive structure, the group of joining structures consisting of: a solder ball, a solder bump.

19. The method according to claim 1,
wherein the electrically conductive structure comprises the same material as the electrically conductive material, and wherein the joining structure is in direct physical and electrical contact with the electrically conductive structure.

20. The method according to claim 1,
wherein the joining structure is in direct physical and electrical contact with the electrically conductive structure, and wherein the electrically conductive structure comprises at least one material from the following group of materials, the group consisting of nickel-phosphide (NiP), nickel-phosphide-palladium-gold (NiP—Pd—Au).

21. The method according to claim 1,
wherein the joining structure comprises at least one material, element or alloy from the following group of materials, the group consisting of: silver, zinc, tin, indium, copper, gold, palladium, lead.

22. The method according to claim 1,
wherein forming an electrically conductive structure over the electrically insulating material, wherein at least part of the electrically conductive structure is in direct physical and electrical connection with the electrically conductive material further comprises
forming the electrically conductive structure wherein physical adhesion between the electrically conductive structure and the first electrically conductive layer is better than adhesion between the electrically conductive structure and the electrically insulating material.

23. The method according to claim 1,
wherein forming an electrically conductive structure over the electrically insulating material, wherein at least part of the electrically conductive structure is in direct physical and electrical connection with the electrically conductive material further comprises
forming the electrically conductive structure, wherein at least a further part of the electrically conductive structure is separated from electrically insulating material.

24. The method according to claim 1, further comprising
forming a layer over the electrically conductive structure and subsequently forming the joining structure over the layer.

25. The method according to claim 24,
wherein the layer comprises at least one material from the following group of materials, the group consisting of: nickel-phosphide (NiP), nickel-phosphide-palladium-gold (NiP—Pd—Au).

* * * * *